(12) United States Patent
Oh et al.

(10) Patent No.: US 6,211,928 B1
(45) Date of Patent: Apr. 3, 2001

(54) LIQUID CRYSTAL DISPLAY AND METHOD FOR MANUFACTURING THE SAME

(75) Inventors: Young-Jin Oh, Seoul; Yong-Min Ha; Jeong-Hyun Kim, both of Kyunggi-do; Kyoung-Nam Lim, Seoul, all of (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 08/872,368

(22) Filed: Jun. 10, 1997

Related U.S. Application Data

(63) Continuation-in-part of application No. 08/826,084, filed on Mar. 25, 1997, now Pat. No. 6,100,954.

(30) Foreign Application Priority Data

| Mar. 26, 1996 | (KR) | 96-08344 |
| Jun. 19, 1996 | (KR) | 96-22404 |
| Jun. 24, 1996 | (KR) | 96-23295 |
| Jun. 24, 1996 | (KR) | 96-23296 |
| Jun. 25, 1996 | (KR) | 96-23448 |
| Aug. 30, 1996 | (KR) | 96-36947 |

(51) Int. Cl.$^7$ .................................. G02F 1/136
(52) U.S. Cl. .................. 349/43; 349/110; 349/122
(58) Field of Search ................ 349/43, 44, 122, 349/38, 110, 111; 257/59, 72; 345/92; 438/30

(56) References Cited

U.S. PATENT DOCUMENTS

| 4,636,038 | 1/1987 | Kitahara et al. | 350/339 |
| 5,229,644 | 7/1993 | Wakai et al. | 257/749 |
| 5,641,974 | 6/1997 | den Boer et al. | 257/59 |
| 5,784,132 | * 7/1998 | Hashimoto | 349/111 |
| 5,818,550 | * 10/1998 | Kadota et al. | 349/43 |
| 5,933,208 | * 8/1999 | Kim | 349/110 |

FOREIGN PATENT DOCUMENTS

| 63-279228 | 11/1988 | (JP) . |
| 63-289965 | 11/1988 | (JP) . |
| 4-068318 | 3/1992 | (JP) . |
| 4-163528 | 6/1992 | (JP) . |

OTHER PUBLICATIONS

M.J. Radler et al., Cyclotene™ Advanced Electronics Resins for High–Aperture AMLCD Applications, SID 96 Applications Digest, pp. 33–36 (1996).

D.J. Perettie et al., Benzocyclobutene as a Planarization Overcoat for Flat Panel Displays, Asia Display '95, pp. 721–724 (1995).

Koji Kishimoto, Low–dielectric–constant interlayer insulating film and its manufacturing method, Electronic Journal, pp. 33–35 (Mar. 1996).

Toshihara Ueki et al., Dye embedded BM resin and three dimensional picture element implemented by BM on Array technology for the first time, Nikkei Microdevices, pp. 60–62 (Jul. 1994).

* cited by examiner

*Primary Examiner*—William L. Sikes
*Assistant Examiner*—Tai V. Duong
(74) *Attorney, Agent, or Firm*—Morgan, Lewis & Bockius LLP

(57) ABSTRACT

A liquid crystal display includes a substrate; a transistor over the substrate, the transistor having a gate, a source, and a drain; a passivation layer over the transistor; a light shielding layer over a portion of the passivation layer over the transistor; a planarization layer over the light shielding layer and the passivation layer, the planarization layer having a contact hole over one of the source and the drain; a pixel electrode over the planarization layer, the pixel electrode being connected to the one of the source and the drain through the contact hole; and an alignment layer over the pixel electrode.

31 Claims, 12 Drawing Sheets

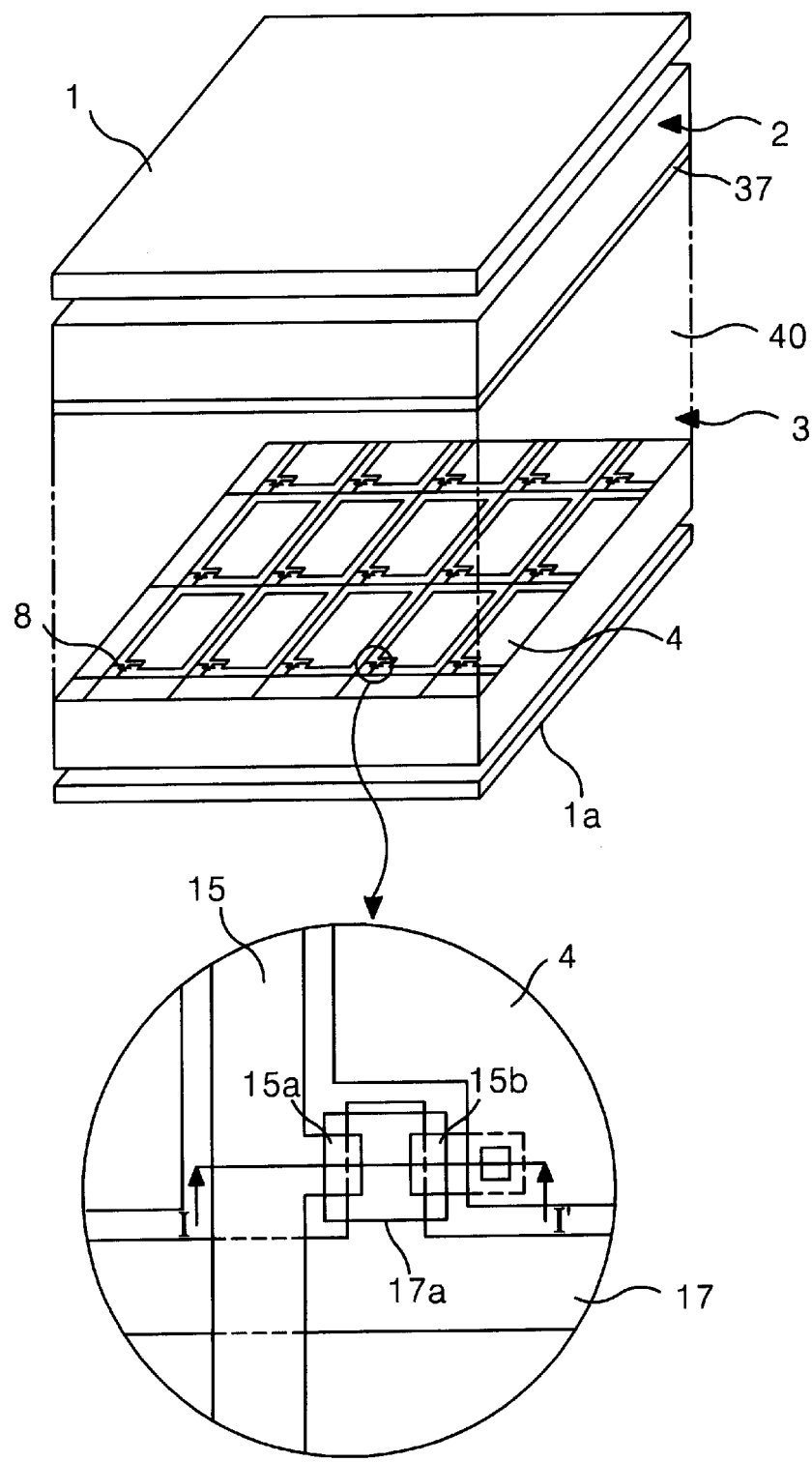

FIG. 3
PRIOR ART
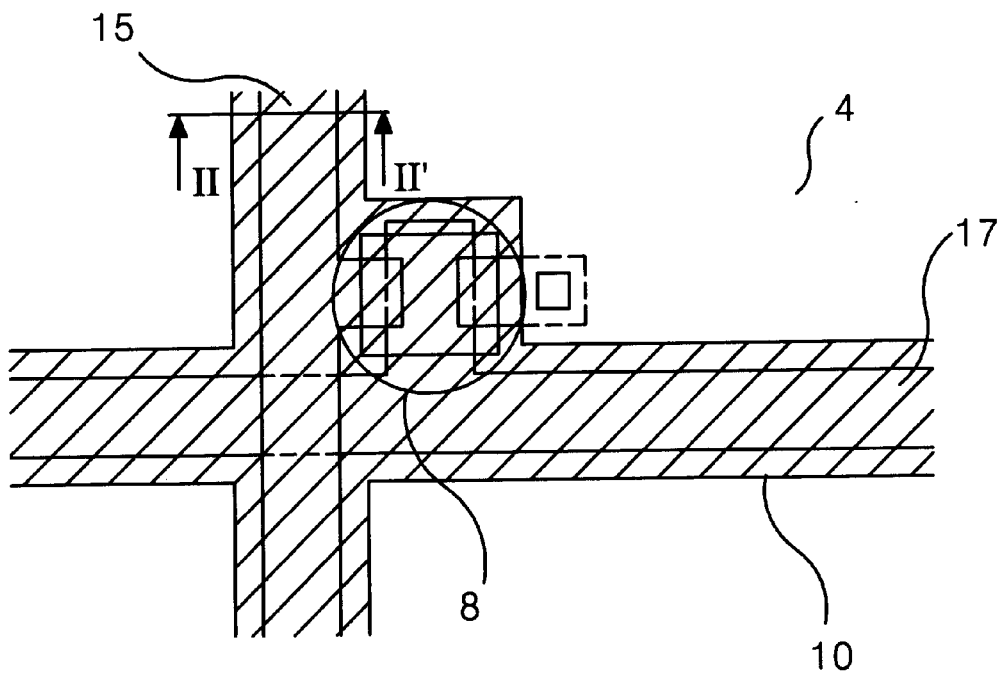
FIG. 4
PRIOR ART
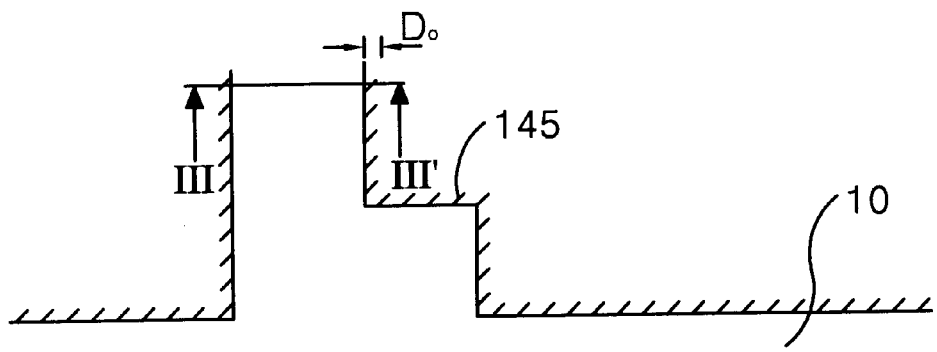
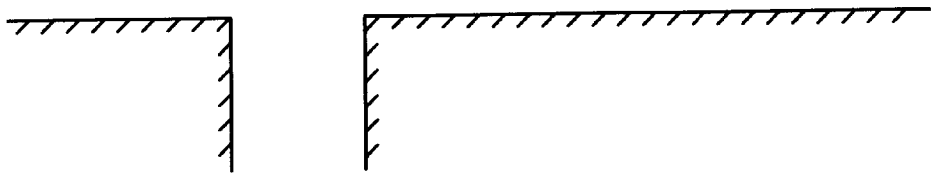

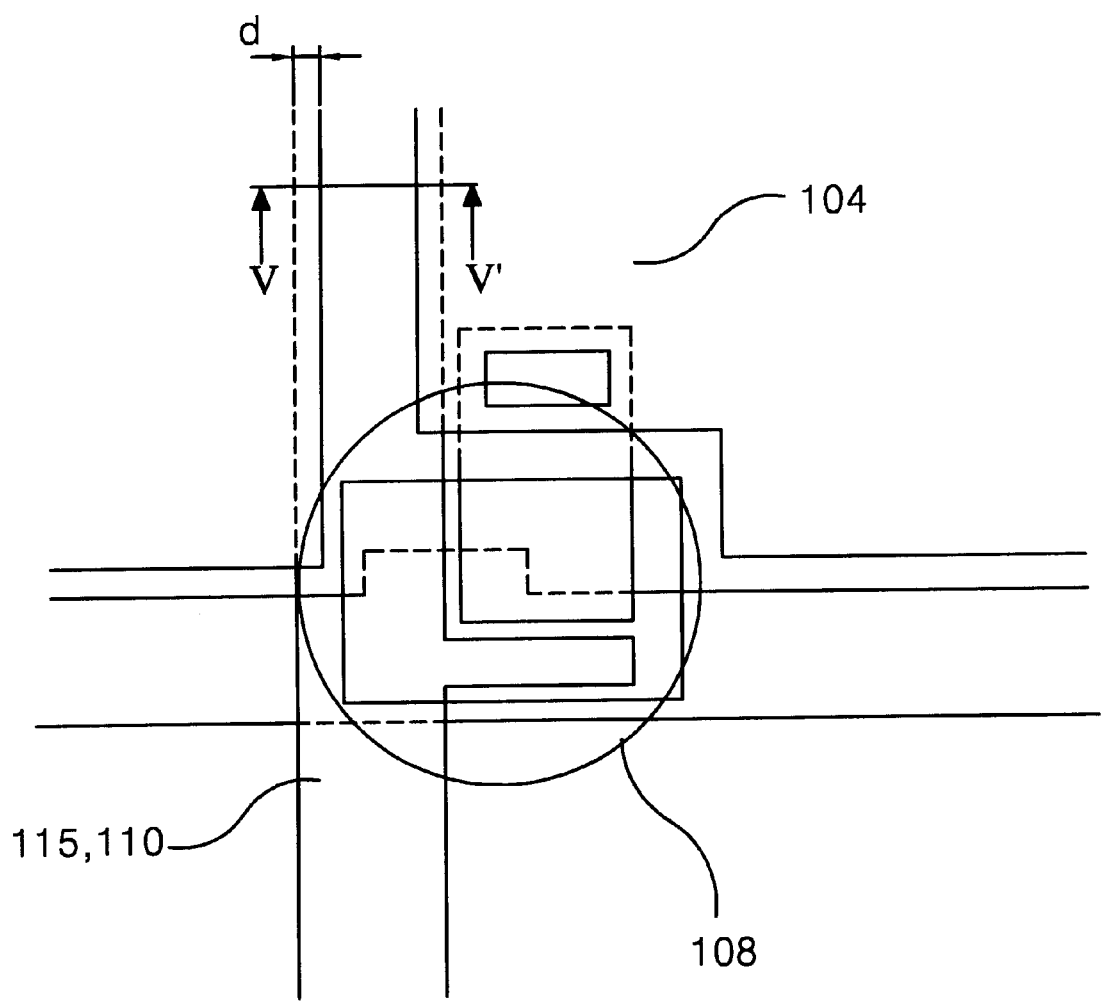

LIQUID CRYSTAL DISPLAY AND METHOD FOR MANUFACTURING THE SAME

CROSS REFERENCE TO RELATED APPLICATION

This application is a continuation-in-part of U.S. patent application Ser. No. 08/826,084 entitled "LIQUID CRYSTAL DISPLAY AND METHOD FOR MANUFACTURING THE SAME," filed on Mar. 25, 1997, now U.S. Pat. No. 6,100,954, the content of which is relied upon and incorporated by reference.

BACKGROUND OF THE INVENTION

1. Field of the Invention

The present invention relates to a liquid crystal display (LCD) and a method for manufacturing the same, and more particularly, to a method for manufacturing a substrate for an LCD having thin film transistors (TFT), and a method for manufacturing the same.

2. Discussion of the Related Art

The structure of a conventional LCD will be described with reference to FIG. 1. The LCD has a first substrate 3 on which pixels are formed in a matrix array. On the first substrate 3, pixel electrodes 4 are formed and each pixel electrode 4 is surrounded by a gate bus line 17 and a data bus line 15. A gate electrode 17a branches off from the gate bus lines 17 and a source electrode 15a branches off from the data bus line 15. A TFT 8 is formed at the intersection of the gate bus line 17 and the data bus line 15. A drain electrode 15b of the TFT is formed to make an electrical contact with the pixel electrode 4. A black matrix (light shielding layer) is formed to cover TFTs 8, gate bus lines 17, and data bus lines 15. An alignment film (alignment layer) is formed on the overall surface of the substrate including the black matrix.

A second substrate 2 having a color filter layer 37 is prepared to face the first substrate 3, defining a gap between the two substrates. A liquid crystal material 40 fills the gap. On the outer sides of the first and second substrates, polarizing plates 1 and 1a are attached. This completes the conventional LCD panel.

Referring to FIGS. 2A and 2B, the structure of the first substrate 3 in the conventional LCD will be described in detail. FIGS. 2A and 2B are cross-sectional views taken along line I–I' of FIG. 1. A process for forming the structure of the first substrate and its individual components are explained with reference to FIG. 2A.

A gate electrode 17a branching off from a gate bus line 17 is formed on a transparent substrate 3. An anodized film 35 is formed on the gate electrode 17a to improve the insulation quality and prevent hillocks. A gate insulation film 23, which is made of an inorganic material such as $SiN_x$ or $SiO_2$, is formed on the overall surface including the gate electrode 17a. A semiconductor layer 22 of amorphous silicon (or a-Si) is formed on the gate insulation film 23 over the gate electrode 17a. This is followed by the formation of an impurity-doped semiconductor layer 25 such as impurity-doped amorphous silicon ($N^+$ a-Si). On the impurity-doped semiconductor layer 25, a source electrode 15a branching off from a data bus line 15 and a drain electrode 15b are formed with a certain gap between them. Here, the source electrode 15a and the drain electrode 15b make ohmic contacts with the impurity-doped semiconductor layer 25. An inorganic passivation (protection) film 26, such as $SiN_x$, is formed to cover the entire surface including the source electrode 15a and the drain electrode 15b. A pixel electrode 4 is formed on the passivation film 26 so as to make an electrical contact with the drain electrode 15b through a contact hole formed in the passivation film 26 located over the drain electrode 15b. Then, a black matrix 10 is formed such that it covers the TFT 8, the gate bus line 17, and the data bus line 15 (FIGS. 3 and 4). This is followed by coating an alignment film 11 made of polyimide, for example.

Another possible structure of the first substrate 3 in the conventional LCD is illustrated in FIG. 2B, which shows components similar to those in FIG. 2A. In this example, an alignment film 11 is formed prior to the formation of the black matrix 10 to prevent an improper rubbing problem of the alignment film 11 near the black matrix 10.

Moreover, the LCD having the structure of FIG. 2A or 2B has the following problems. First, in the structure of the first substrate shown in FIG. 2A, the alignment film has a stepped profile due to steps formed by the pixel electrode 4 and black matrix 10. This results in improper rubbing of the alignment film near the steps, which in turn causes light leakage. Thus, the quality of an LCD such as contrast is reduced. To better understand this phenomenon, the formation and rubbing of an alignment film are explained in detail with reference to FIGS. 5 and 6.

FIG. 5 is a cross-sectional view taken along line III–III' in FIG. 4. The alignment film 11 in FIG. 2A is formed by transferring a material for alignment film, such as polyamide, polyimide, or silicon oxide, printed on a roller 150 onto the surface of the first substrate 3 including the black matrix 10. The alignment film is then hardened and rubbed to align liquid crystal in a direction. As shown in FIG. 6, the rubbing process creates grooves (wave-like lines in the figure) on the alignment film 11 in a certain direction by using a rubbing drum 131. Here, the rubbing drum 131 is lapped with a rubbing cloth 130 and moved in the C direction while being energized in the B direction and rotating in the A direction. A portion $D_0$ marked by oblique lines in FIG. 4 (133 in FIG. 6) represents the area where the rubbing process is not properly carried out due to the steps formed by the black matrix 10. The width of $D_0$ in FIG. 4 is 1–2 $\mu$m when the thickness of black matrix is 1–2.5 $\mu$m. Such a region may be eliminated by a photo-array of an alignment film using polyvinylcinnamate (PVCN), polyvinylfluorocinnamate (PVCN-F), polysiloxanes, or polyvinylchloride (PVC). However, the problem of a non-uniform cell gap, which will be described next, still remains unsolved.

Second, as shown in FIGS. 2A and 2B, the first substrate 3 in the conventional LCD reveals a stepped surface due to a multi-layer structure including a black matrix 10. This causes a non-uniform cell gap for the LCD. Thus, the quality of the LCD and the yield decrease due to instability in filling liquid crystal in the gap. In addition, the quality of an LCD cannot be maintained if the liquid crystal is in direct contact with the black matrix as shown in FIG. 2B. The black matrix or its color pigment may contaminate the liquid crystal. In general, a black matrix is made of a negative photoresist containing black color pigment.

Third, in the conventional LCD, pixel electrodes cannot be formed to overlap data or gate bus lines. This is due to the stepped surface of the first substrate, the improper rubbing of the alignment film, and a high dielectric constant of an inorganic insulation film (protection film 26). If a pixel electrode is formed to overlap a data bus line located beneath an inorganic insulation film, blinking or flickering of a display occurs because of the interference between the data bus line voltage and the pixel electrode voltage. Light leakage due to the improper rubbing may also arise at the overlapping portion. Thus, in general, the pixel electrode is disposed a certain distance away from the step of data bus lines. In this case, a sufficient aperture ratio cannot be obtained as illustrated in FIG. 7. In FIG. 7, an inorganic insulation film 26 such as $SiN_x$ or $SiO_2$ covers the stepped data bus-line 15, and a pixel electrode 4 is formed a distance $D_2$ away from the data bus line 15. The distance $D_1$ provides the tolerance in assembling the first substrate and the second substrate. Thus, the aperture ratio in the conventional LCD is smaller than the maximum possible value by the area determined by $D_3=(D_1+D_2)$.

As explained in detail above, the first substrate has a stepped surface due to a black matrix and/or the black matrix is in direct contact with a liquid crystal material. This results in problems, such as light leakage through the area near the steps of the black matrix, a non-uniform cell gap, contamination of liquid crystal, and a small aperture ratio.

SUMMARY OF THE INVENTION

Accordingly, the present invention is directed to a liquid crystal display and method for manufacturing the same that substantially obviate one or more of the problems due to limitations and disadvantages of the related art.

An objective of the invention is to provide an LCD with a uniform cell gap.

Another objective of this invention is to prevent contamination of liquid crystal from a black matrix or its color pigment in an LCD.

A third objective of the invention is to eliminate light leakage around the steps of a black matrix due to an improper rubbing of the alignment film in an LCD.

A further objective of the invention is to improve the aperture ratio of an LCD.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for manufacturing a first substrate of liquid crystal display device comprises the steps of forming data bus lines and gate bus lines on a transparent substrate; forming switching elements in connection with the data bus lines and the gate bus lines; forming a black matrix to cover the switching element; forming a planarization film covering the data bus lines, the gate bus lines and the black matrix; and forming an alignment film on the planarization film.

In another aspect of the present invention, a first substrate of a liquid crystal display device comprises a substrate; a switching element connected to a data bus line and a gate bus line formed on the transparent substrate; a black matrix covering the switching element; a planarization film covering the black matrix, the data bus line, the gate bus line and the transparent substrate; and an alignment film covering the planarization film.

In another aspect of the present invention, a liquid crystal display comprises a substrate; a transistor over the substrate, the transistor having a gate, a source, and a drain; a passivation layer over the transistor; a light shielding layer on a portion of the passivation layer over the transistor; a planarization layer over the light shielding layer and the passivation layer, the planarization layer having a contact hole over one of the source and the drain; a pixel electrode over the planarization layer, the pixel electrode being connected to the one of the source and the drain through the contact hole; and an alignment layer over the pixel electrode.

In another aspect of the present invention, a method for manufacturing a liquid crystal display having a substrate, comprises forming a transistor over the substrate, the transistor having a gate, a drain, and a source forming a light shielding layer over the transistor forming a planarization layer over an overall surface of the substrate including the light shielding layer; and forming an alignment layer over the planarization layer.

In a further aspect of the present invention, a liquid crystal display includes a substrate; a transistor over the substrate, the transistor having a gate, a source, and a drain; a pixel electrode contacting one of the source and drain; a passivation layer over the transistor and the pixel electrode; a light shielding layer on a portion of the passivation layer over the transistor; a planarization layer over the light shielding layer and the passivation layer; and an alignment layer over the planarization layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a perspective view showing a conventional LCD structure;

FIG. 3 is a plan view showing the pattern of a conventional black matrix;

FIG. 4 is a plan view showing a light leakage portion around the black matrix in the conventional LCD;

FIGS. 9A and 9B a plan views of the LCD according to the first embodiment of the present invention;

DETAILED DESCRIPTION OF THE PREFERRED EMBODIMENT

Reference will now be made in detail to the preferred embodiments of the present invention, examples of which are illustrated in the accompanying drawings A method for manufacturing a first substrate of an LCD according to a first embodiment of the present invention is explained with reference to FIGS. 8A to 8J.

Figure 8A:
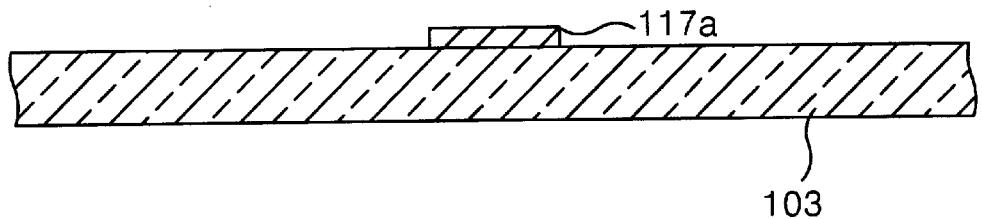
FIGS. 8A to 8J are cross-sectional views showing a manufacturing process of the first substrate for an LCD according to a first embodiment of the present invention.
Figure 8B:
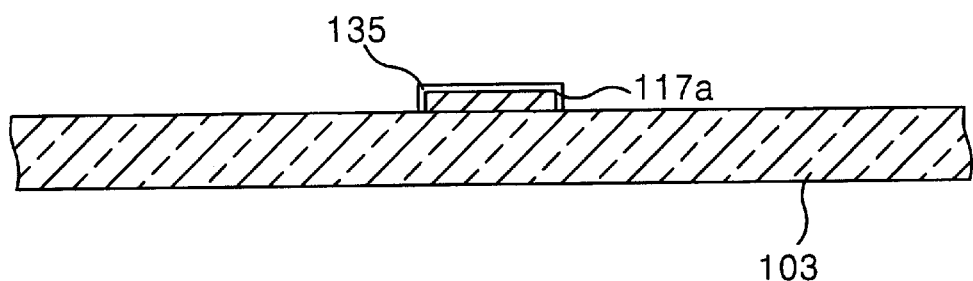
Figure 8C:
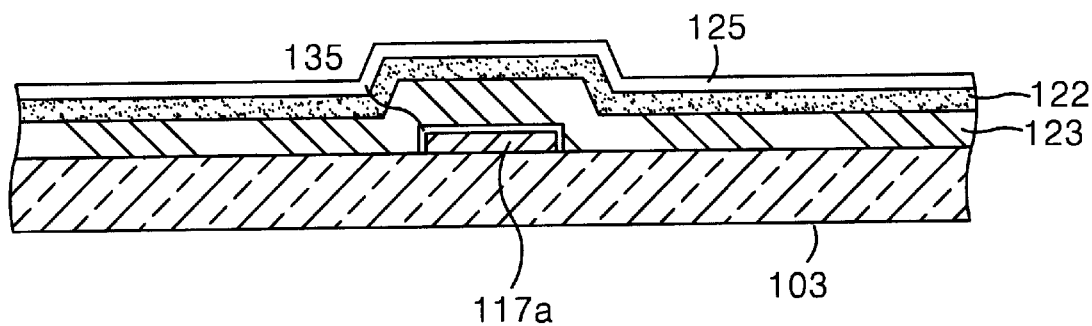
Figure 8D:
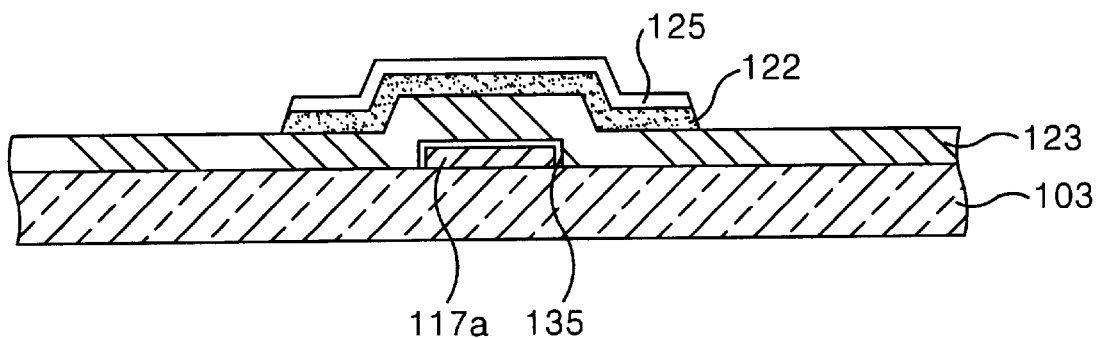

A metal such as aluminum is deposited on a first transparent substrate 103. A photoresist is coated and patterned. The aluminum film is etched by wet etching, for example, to form a gate electrode 117a and a gate bus line, as shown in FIG. 8A. Here, it is desirable to form the gate electrode 117a in a tapered shape so as to alleviate the step. Then, the gate electrode 117a is anodized to form an anodized film 135 to prevent hillocks and improve electrical insulation, as shown in FIG. 8B. This is followed by serial depositions of a gate insulation film 123 made of $SiN_x$ or $SiO_2$, a-Si (122), and $N^+$ a-Si (125) as shown in FIG. 8C. A photoresist is then coated on the surface and patterned. A semiconductor layer 122 and an impurity-doped semiconductor layer 125 are formed by patterning the a-Si and $N^+$ a-Si layers simultaneously according to the patterned photoresist, as shown in FIG. 8D.

Figure 8E:
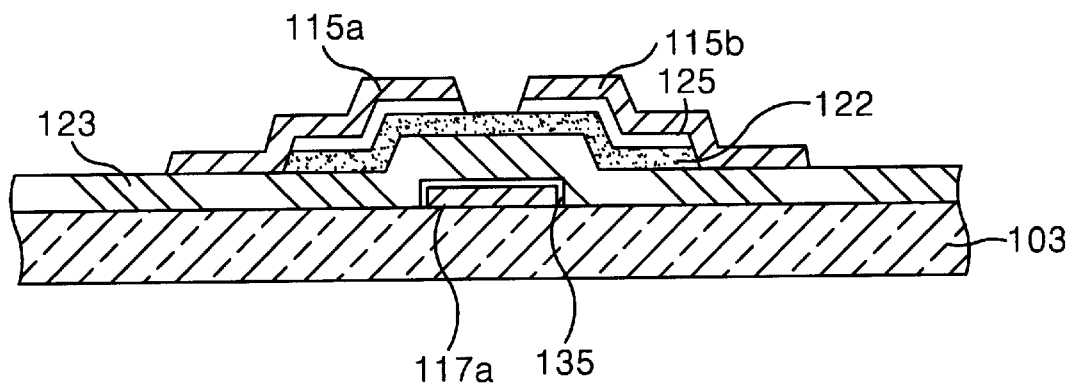
Figure 8F:
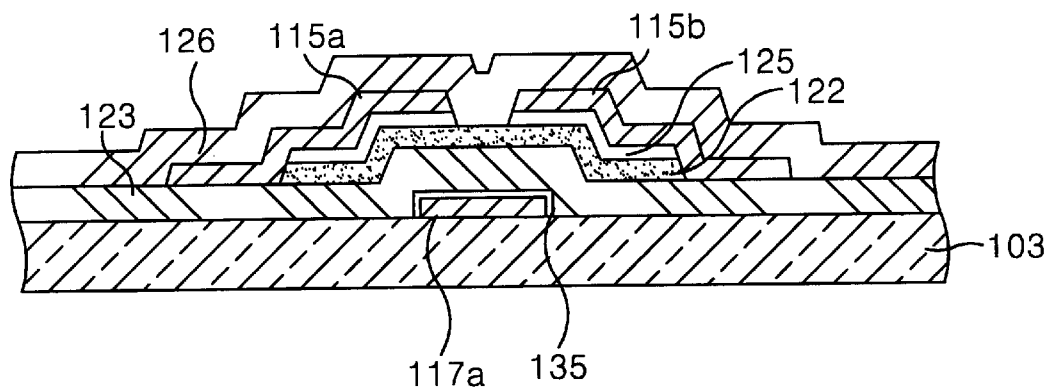

Next, a metal, such as Cr or Al, is sputtered on the overall surface to form a metal film. By a similar method to that of forming the gate electrode, a source electrode 115a, a data bus line, and a drain electrode 115b are formed. By using the source electrode 115a and the drain electrode 115b as an etching mask, the center portion of the impurity-doped semiconductor layer 125 is removed so as to create two separate parts which make ohmic contacts with the source electrode 115a and the drain electrode 115b, respectively (FIG. 8E). Then, as shown in FIG. 8F, a passivation film 126 (200–500 Å thick) is formed by depositing an inorganic material such as $SiN_x$ or $SiO_2$. In general, this insulation film is formed to protect a TFT 108, eliminating possible contamination from a black matrix 110, which is to be formed over the semiconductor layer 122. However, the passivation film 126 may be omitted if the contamination is not significant.

Figure 8G:
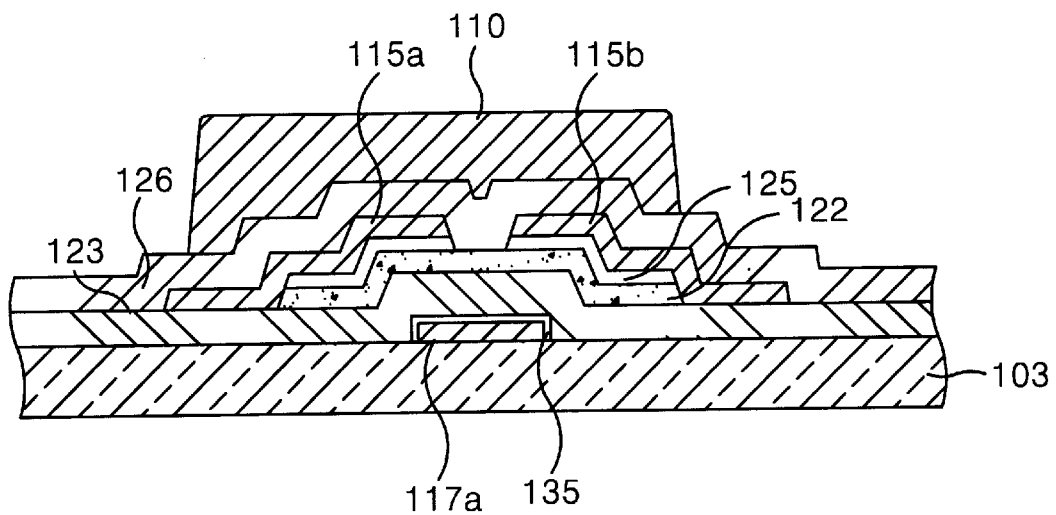
Figure 8H:
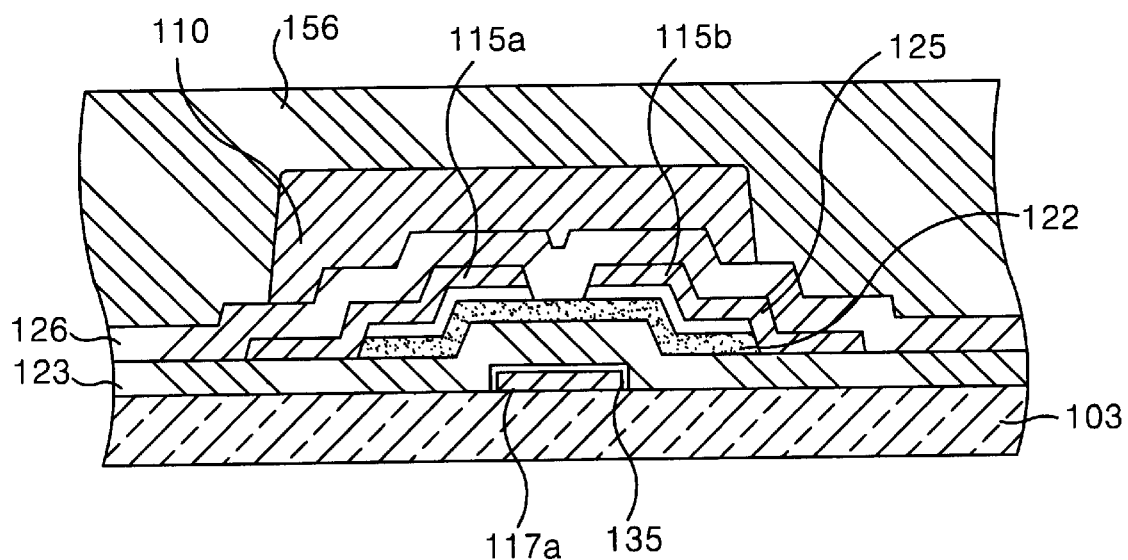
Figure 8I:
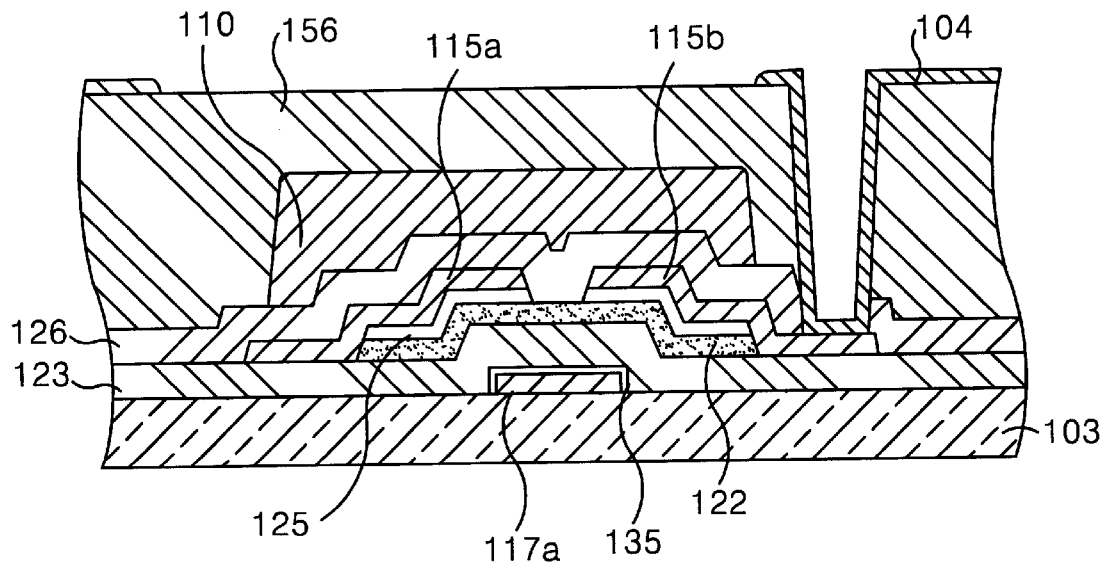

A black resin (more than 1 μm thick) is coated on the surface of the passivation film 126. A negative photoresist including a black color pigment, such as polyimide, is used as the black resin. The upper processing temperature limit of this material is about 260° C. The black resin is patterned to form a black matrix 110 (light shielding layer), as shown in FIG. 8G. Then, as shown in FIG. 8H, the surface is coated with a planarization film 156 (planarization layer) which includes spin on glass (SOG) or an organic material having an Si bond structure including benzocyclobutene (BCB), PFCB, fluorinated parylene, teflon, cytop, or fluoropolyarylether.

The planarization film 156 has a smooth surface, and accordingly alleviates the steps of multi-layer structure underneath. This provides a uniform cell gap between the two substrates and improves the quality of the LCD by reducing instability in filling liquid crystal in the gap. Also, the planarization of the present invention prevents light leakage near the steps of the black matrix by providing a uniform rubbing profile of an alignment film.

Figure 8J:
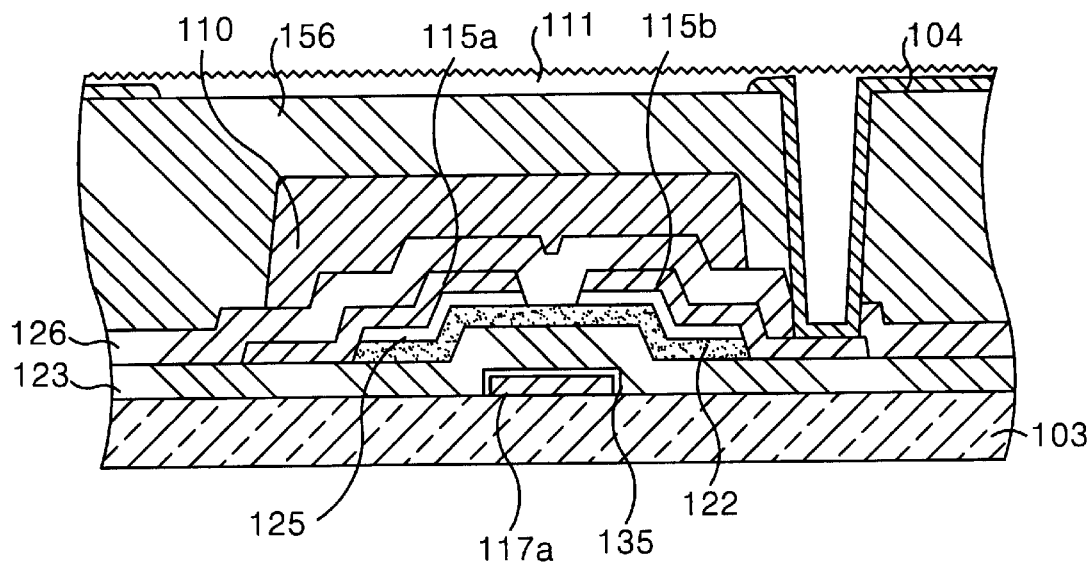

Next, a contact hole is formed over the drain electrode through the planarization film 156 and the passivation film 126. Then, indium tin oxide (ITO) is deposited on the surface and patterned to form a pixel electrode 104, as shown in FIG. Finally, an alignment film 111 (alignment layer), such as polyamide, polyimide, or silicon oxide, is formed and rubbed to have a groove (wave-like pattern) on its surface, as shown in FIG. 8J. Alternatively, the wave-like pattern can be formed by a photo-array of a film that uses polyvinylcinnamate (PVCN), polyvinylfluorocinnamate (PVCN-F), polysiloxanes, or polyvinylchloride (PVC), for example.

In general, the planarization film 156 of the present invention uses materials having a lower dielectric constant than a conventional inorganic insulation film. Thus, the pixel electrode 104 can be extended so as to overlap data or gate bus lines. The structure of the extended pixel electrode 104 as opposed to that of a conventional method is explained with reference to FIGS. 9A, 9B, and 10.

Figure 9A:
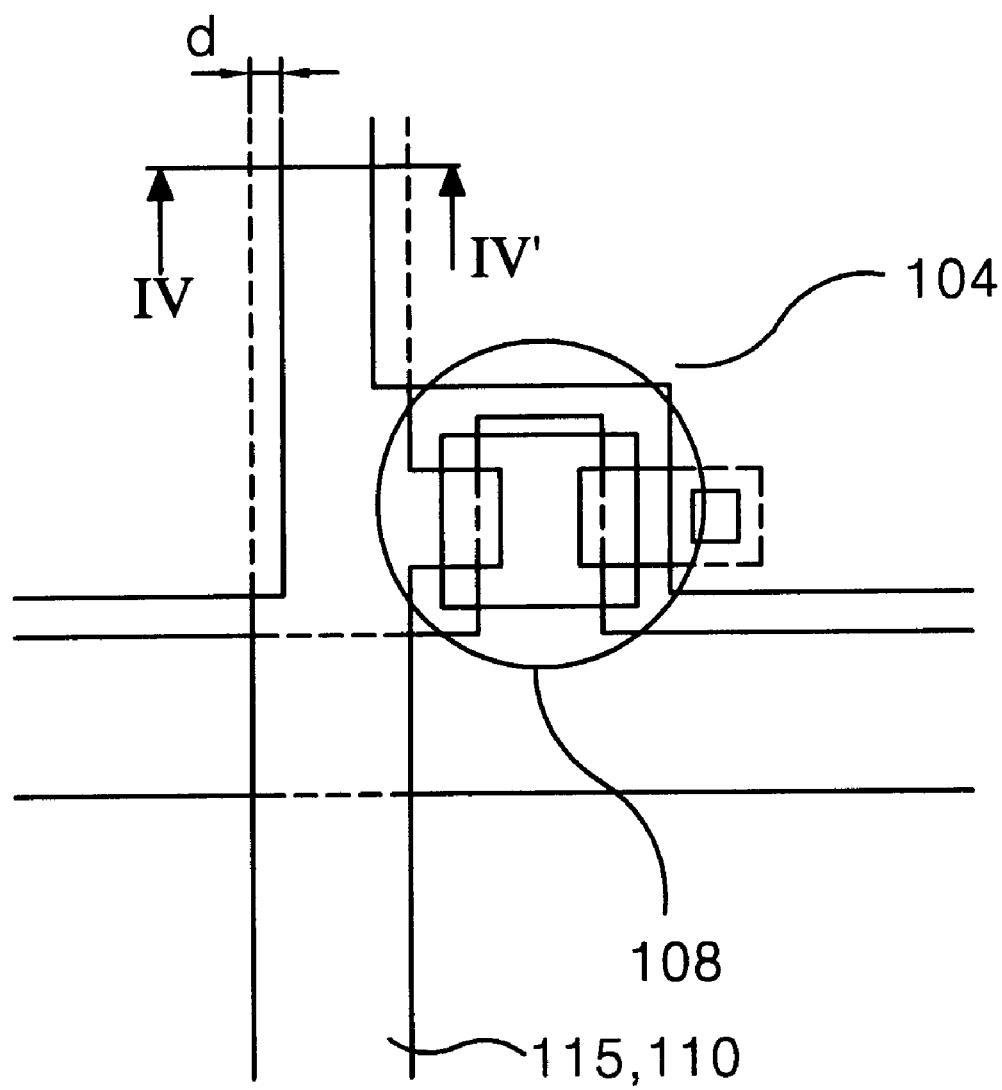
Figure 10:
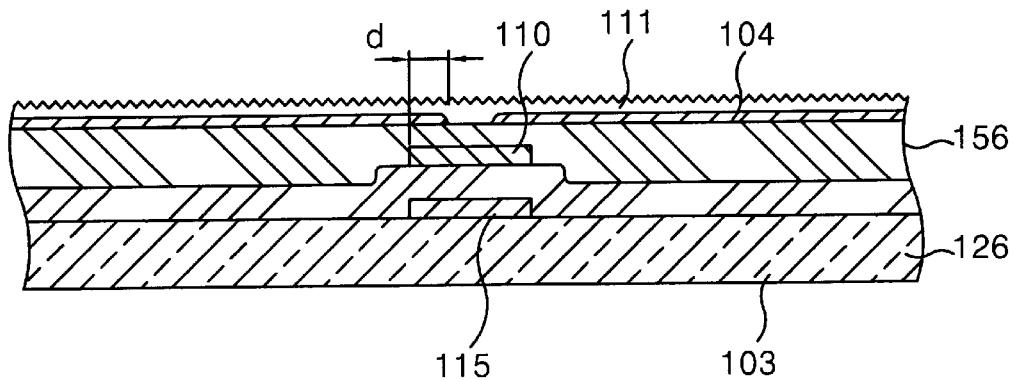
FIG. 10 is a cross-sectional view taken along line IV–IV' in FIG. 9A.

The black matrix 110 may be omitted when the material for the data bus line 115 is opaque. However, in order to completely eliminate light leakage, it is still desirable to form the black matrix 110 over the data bus line 115. FIG. 9A is a plan view of the first substrate showing a TFT 108 having an I type channel and FIG. 9B is a plan view of the first substrate showing a TFT 108 having an L type channel. FIG. 10 is a cross-sectional view taken along line IV–IV' in FIG. 9A. Here, a black matrix 110 is formed such that it is aligned with the data bus line 115. Thus, the pixel electrode 104 can be formed to overlap the data bus line 115. Accordingly, an effective pixel electrode area, which excludes a part d in FIG. 10, is free from an improper rubbing problem.

Figure 2A:
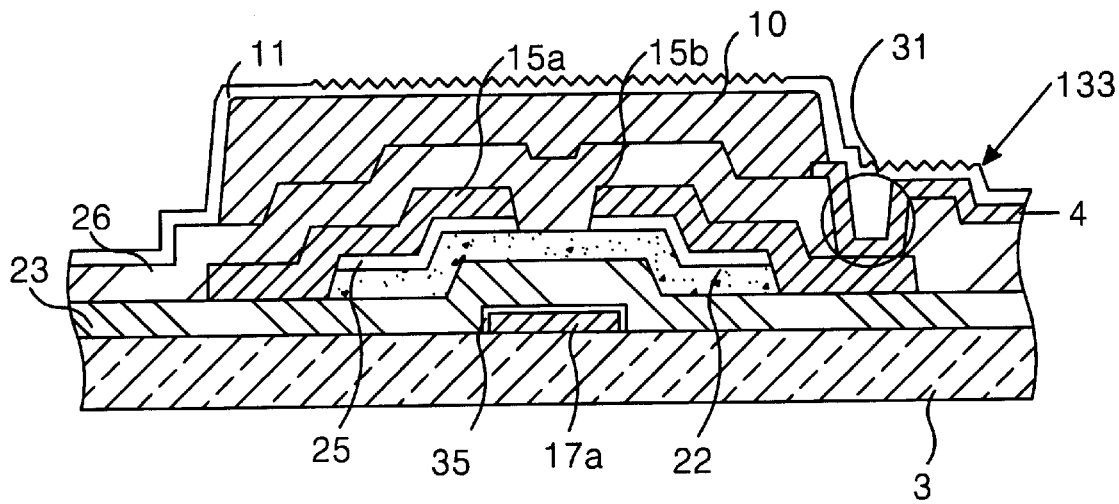
FIGS. 2A and 2B are cross-sectional views showing the first substrate in the conventional LCD.
Figure 2B:
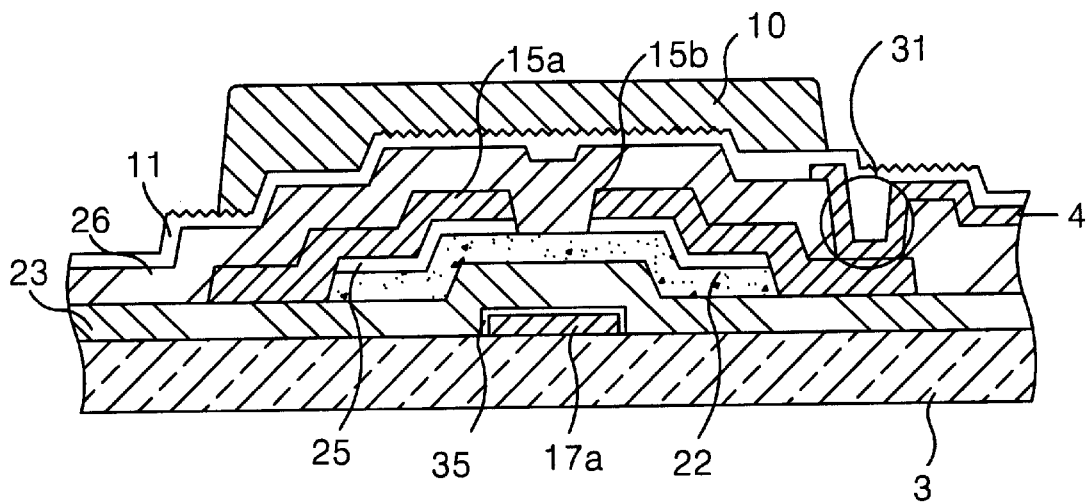
Figure 5:
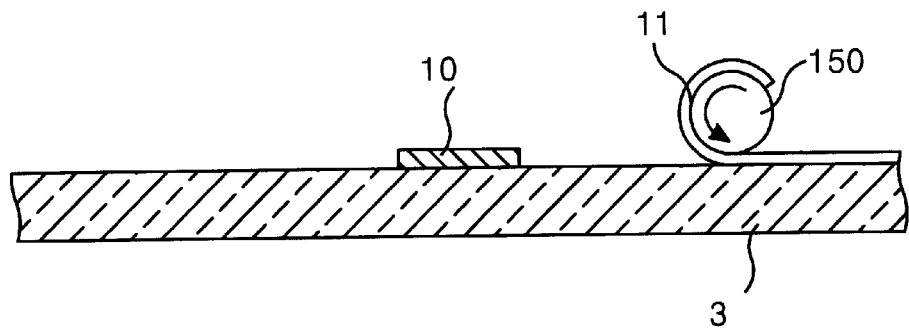
FIG. 5 is a cross-sectional view showing the coating process of an alignment film in the conventional LCD.
Figure 6:
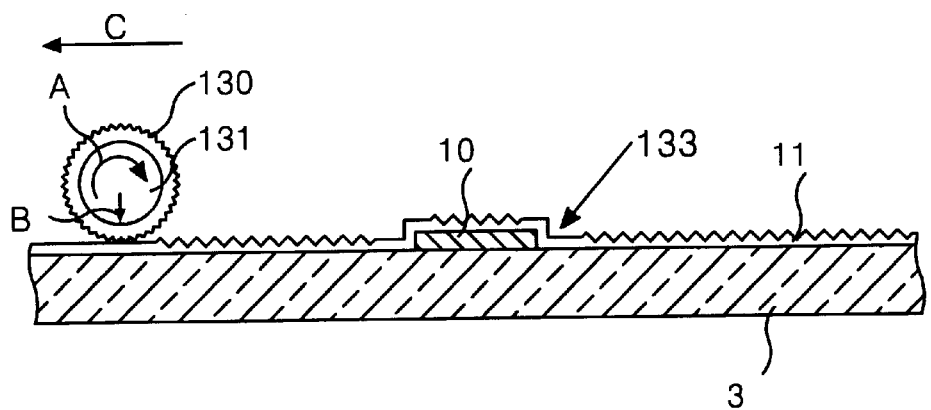
FIG. 6 is a cross-sectional view showing the rubbing process of the alignment film in the conventional LCD.
Figure 7:
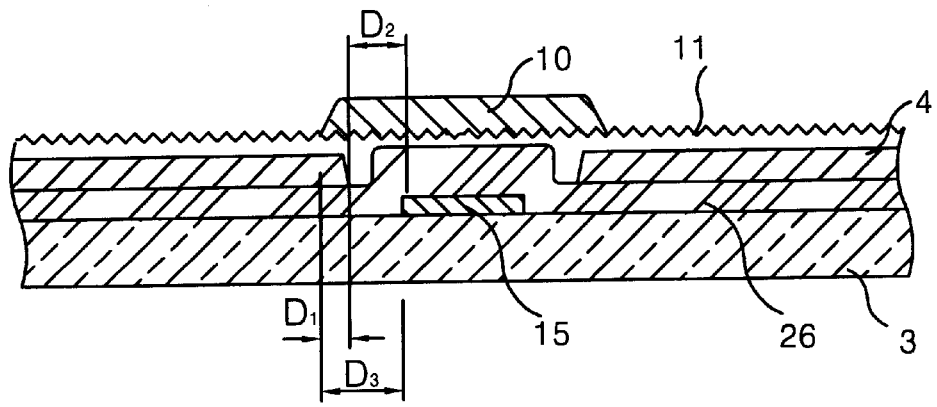
FIG. 7 is a cross-sectional view taken along line II–II' in FIG. 3.

In order to explain the invention more clearly, the present invention shown in FIG. 10 is compared with the conventional method shown in FIG. 7. Suppose that the widths of data bus line 15 of FIG. 7 and the data bus line 115 of FIG. 10 are the same. Then, FIG. 10 shows that the pixel electrode 104 is wider than that in FIG. 7 by amount $D_3$ at each side. Here, a part of the pixel electrode 104 shown as d in FIG. 10 is excluded from consideration, since the black matrix 110 blocks light at that area.

In a similar manner, the size of pixel electrode 104 can also be increased by aligning the black matrix 110 with the TFT 108 and a gate bus line 117. Thus, the application of a planarization film 156 on the black matrix 110 provides a highly-improved aperture ratio.

Moreover, since the planarization film 156 isolates the liquid crystal from the black matrix 110, contamination of liquid crystal materials by the black matrix 110 or its color pigment can be prevented in the present invention.

Figure 11:
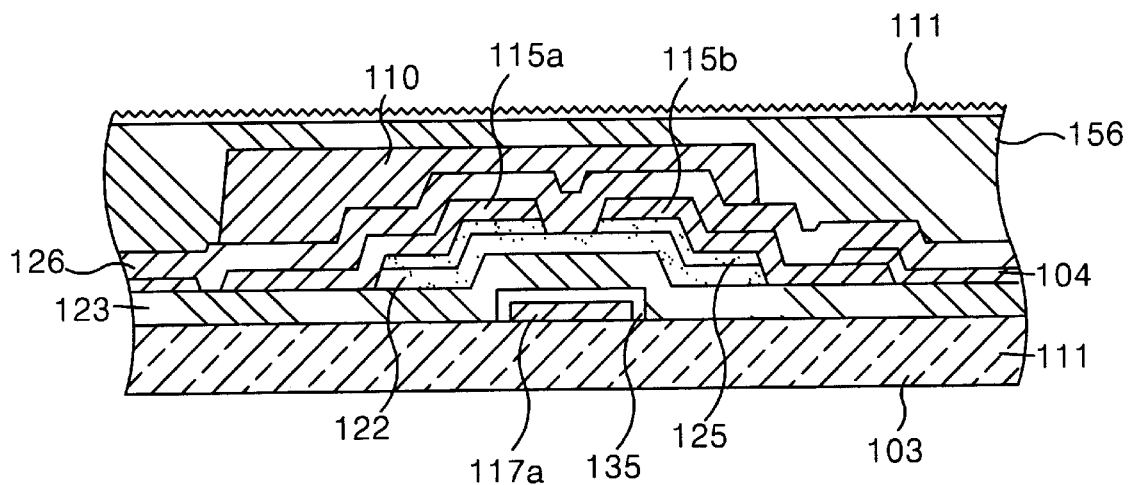
FIG. 11 is a cross-sectional view of an LCD according to a second embodiment of the president invention.

FIG. 11 shows a second embodiment of the present invention. The first embodiment illustrated a case where the pixel electrode 104 is formed on the passivation film 126 (ITO on passivation film: IOP). In the second embodiment, the planarization film 156 is applied to a structure in which the pixel electrode 104 is formed under the passivation film 126, as shown in FIG. 11. The advantages of the present invention also result from the second embodiment's similar to the first embodiment. A detailed explanation of the second embodiment is omitted since the inventive method and structure is clear from the explanation of the first embodiment.

In the manufacture of a first substrate for an LCD of the present invention, the formation of a planarization film on the stepped surface structure that includes a black matrix results in a smooth surface profile. This provides an improved aperture ratio, suppression of light leakage coming through the area around the black matrix, and a uniform cell gap necessary for filling liquid crystal stably. In addition, a high quality LCD can be obtained by preventing contamination of a liquid crystal material from a black matrix material or its color pigment. This is because the planarization film isolates the black matrix from the liquid crystal material.

Accordingly, the present invention introduces a planarization film to the manufacture of the first substrate, producing a leveled or planar surface for the stepped multilayer structure including the black matrix, prior to formation of an alignment film. Since the planarization film has an even surface, the subsequent formation of an alignment film also has an even surface. This results in a uniform cell gap between the substrates of an LCD. Also, an alignment film can be uniformly rubbed on the overall surface, preventing leakage of light. Since the planarization film isolates a liquid crystal material from the black matrix, contamination of liquid crystal can be prevented. Also, the dielectric constant of the planarization film is lower in the present invention than that of a conventional inorganic insulation film, allowing pixel electrodes to be formed overlapping data bus lines. Thus, the aperture ratio can be improved. The planarization film of the present invention uses an organic material (organic insulation material) including benzocyclobutene (BCB) or spin on glass (SOG).

It will be apparent to those skilled in the art that various modifications and variations can be made in the liquid crystal display and method for manufacturing the same of the present invention without departing from the spirit or scope of the invention. Thus, it is intended that the present invention cover the modifications and variations of this invention provided they come within the scope of the appended claims and their equivalents.

What is claimed is:

1. A liquid crystal display comprising:
   a substrate;
   a transistor over the substrate, the transistor having a gate, a source, and a drain;
   a passivation layer over the transistor;
   a light shielding layer on a portion of the passivation layer over the transistor, the light shielding layer made of a black resin having thickness above 1 $\mu$m;
   a planarization layer over the light shielding layer and the passivation layer, the planarization layer having a contact hole over one of the source and the drain;
   a pixel electrode over the planarization layer, the pixel electrode being connected to the one of the source and the drain through the contact hole; and
   an alignment layer over the pixel electrode.

2. The liquid crystal display according to claim 1, further comprising a gate bus line and a data bus line over the substrate, the gate bus line being connected to the gate of the transistor and the data bus line being connected to one of the source and the drain, wherein the light shielding layer covers the gate bus line and the data bus line.

3. The liquid crystal display according to claim 2, wherein a portion of the pixel electrode overlaps at least one of the data bus line and the gate bus line.

4. The liquid crystal display according to claim 1, wherein the planarization layer is an organic insulation material.

5. The liquid crystal display according to claim 4, wherein the organic insulation material includes benzocyclobutene.

6. The liquid crystal display according to claim 1, wherein the planarization layer includes a material of spin on glass.

7. The liquid crystal display according to claim 1, wherein the passivation layer includes an inorganic insulation layer.

8. The liquid crystal display according to claim 7, wherein the inorganic insulation layer includes one of $SiN_x$ and $SiO_2$.

9. The liquid crystal display according to claim 7, wherein the planarization layer includes a material of spin on glass.

10. The liquid crystal display according to claim 7, wherein the planarization layer includes an organic insulation material.

11. The liquid crystal display according to claim 10, wherein the organic insulation material includes benzocyclobutene.

12. A method for manufacturing a liquid crystal display having a substrate, comprising:
    forming a transistor over the substrate, the transistor having a gate, a drain, and a source;
    forming a light shielding layer made of a black resin having a thickness above 1 $\mu$m over the transistor;
    forming a planarization layer over an overall surface of the substrate including the light shielding layer; and
    forming an alignment layer over the planarization layer.

13. The method according to claim 12, further comprising the step of forming a passivation layer over the transistor before the light shielding layer forming step.

14. The method according to claim 13, wherein the passivation layer includes one of $SiN_x$ and $SiO_2$.

15. The method according to claim 12, wherein the planarization layer includes an organic insulation material.

16. The method according to claim 15, wherein the organic insulation material includes benzocyclobutene.

17. The method according to claim 12, wherein the planarization layer includes a material of spin on glass.

18. The method according to claim 12, further comprising the steps of:
    forming a gate bus line over the substrate, the gate bus line being connected to the gate of the transistor; and
    forming a data bus line over the substrate, the data bus line being connected to one of the source and the drain,
    wherein the light shielding layer is formed to cover the gate bus line and the data bus line.

19. The method according to claim 18, further comprising the step of forming a pixel electrode over the substrate before the alignment layer forming step, the pixel electrode being connected to one of the source and drain.

20. The method according to claim 19, wherein a portion of the pixel electrode is formed to overlap at least one of the data bus line and the gate bus line.

21. A liquid crystal display comprising:
    a substrate;
    a transistor over the substrate, the transistor having a gate, a source, and a drain;
    a pixel electrode contacting one of the source and drain;
    a passivation layer over the transistor and the pixel electrode;
    a light shielding layer on a portion of the passivation layer over the transistor, the light shielding layer made of a black resin having thickness above 1 $\mu$m;
    a planarization layer over the light shielding layer and the passivation layer; and
    an alignment layer over the planarization layer.

22. The liquid crystal display according to claim 21, further comprising a gate bus line and a data bus line over the substrate, the gate bus line being connected to the gate of the transistor and the data bus line being connected to one of the source and the drain, wherein the light shielding layer covers the gate bus line and the data bus line.

23. The liquid crystal display according to claim 22, wherein a portion of the pixel electrode overlaps at least one of the data bus line and the gate bus line.

24. The liquid crystal display according to claim 21, wherein the planarization layer is an organic insulation material.

25. The liquid crystal display according to claim 24, wherein the organic insulation material includes benzocyclobutene.

26. The liquid crystal display according to claim 21, wherein the planarization layer includes a material of spin on glass.

27. The liquid crystal display according to claim 21, wherein the passivation layer includes an inorganic insulation layer.

28. The liquid crystal display according to claim 27, wherein the inorganic insulation layer includes one of $SiN_x$ and $SiO_2$.

29. The liquid crystal display according to claim 27, wherein the planarization layer includes a material of spin on glass.

30. The liquid crystal display according to claim 27, wherein the planarization layer includes an organic insulation material.

31. The liquid crystal display according to claim 30, wherein the organic insulation material includes benzocyclobutene.

* * * * *